(12) United States Patent
Park et al.

(10) Patent No.: US 7,995,390 B2
(45) Date of Patent: Aug. 9, 2011

(54) NAND FLASH MEMORY ARRAY WITH CUT-OFF GATE LINE AND METHODS FOR OPERATING AND FABRICATING THE SAME

(75) Inventors: Byung-Gook Park, Seoul (KR); Seong Jae Cho, Seoul (KR)

(73) Assignee: Seoul National University Industry Foundation (KR)

( * ) Notice: Subject to any disclaimer, the term of this patent is extended or adjusted under 35 U.S.C. 154(b) by 368 days.

(21) Appl. No.: 12/361,107

(22) Filed: Jan. 28, 2009

(65) Prior Publication Data

US 2009/0207667 A1 Aug. 20, 2009

(30) Foreign Application Priority Data

Feb. 15, 2008 (KR) .......................... 10-2008-0014125

(51) Int. Cl.
*G11C 16/04* (2006.01)
(52) U.S. Cl. ............... 365/185.17; 365/185.33; 365/226
(58) Field of Classification Search ............. 365/185.17, 365/185.33, 226
See application file for complete search history.

(56) References Cited

U.S. PATENT DOCUMENTS

| 6,878,991 | B1 | 4/2005 | Forbes | |
| 7,643,346 | B2 * | 1/2010 | Toriyama et al. | 365/185.17 |
| 7,692,252 | B2 * | 4/2010 | Sato et al. | 257/390 |
| 7,729,171 | B2 * | 6/2010 | Aritome | 365/185.17 |
| 2007/0242515 | A1 * | 10/2007 | Aritome | 365/185.17 |
| 2008/0175053 | A1 * | 7/2008 | Lue et al. | 365/185.05 |
| 2008/0296659 | A1 | 12/2008 | Park et al. | |
| 2009/0059669 | A1 * | 3/2009 | Toriyama et al. | 365/185.17 |
| 2009/0127613 | A1 * | 5/2009 | Ikehashi | 257/316 |
| 2010/0034020 | A1 * | 2/2010 | Tanaka et al. | 365/185.03 |

FOREIGN PATENT DOCUMENTS

KR 10-0777016 11/2007

* cited by examiner

*Primary Examiner* — Tuan T. Nguyen
(74) *Attorney, Agent, or Firm* — Gerald E. Hespos; Michael J. Porco

(57) ABSTRACT

A NAND flash memory array, an operating method and a fabricating method of the same are provided. The NAND flash memory array has a cut-off gate line under a control gate in order to operate two cells having vertical channels independently with one control gate (i.e., a shared word line). The memory cell area is reduced considerably compared to the conventional vertical channel structure, and is better for high integration. A shared cut-off gate turn off is made during a programming operation and prevents programming the opposite cell by a self-boosting effect. It is possible to shield electrically with a shared word line (a control gate) during a reading operation, and minimizes the effect of storage condition of the opposite cell. Also, the NAND flash memory array can be fabricated by using the conventional CMOS process.

17 Claims, 13 Drawing Sheets

| CONTROL LINE | PROGRAM | ERASE | READ | |
|---|---|---|---|---|
| WL1 | HIGH | FLOAT | HIGH | |
| WL2 | $V_{PGM}$ | GND | HIGH | |
| WL3 | HIGH | FLOAT | HIGH | |
| CG1 | HIGH | FLOAT | HIGH | |
| CG2 | LOW | GND | HIGH | |
| CG3 | HIGH | FLOAT | HIGH | |
| GSL | $V_{CC}$ | FLOAT | HIGH | |
| Source | GND | FLOAT | $V_{READ}$ | GND |
| SSL | $V_{CC}$ | FLOAT | HIGH | |
| Drain | $V_{CC}$ | FLOAT | GND | $V_{READ}$ |
| Substrate | FLOAT | $V_{ERASE}$ | GND | |

NAND FLASH MEMORY ARRAY WITH CUT-OFF GATE LINE AND METHODS FOR OPERATING AND FABRICATING THE SAME

BACKGROUND OF THE INVENTION

1. Field of the Invention

The present invention relates to a NAND flash memory array and methods for operating and fabricating the same, and more particularly to a NAND flash memory array having a cut-off gate line under a control gate in order to operate two vertical channels independently with one control gate (i.e., a shared word line).

2. Description of the Related Art

These days, flash memories as non-volatile memories have been becoming popular. A conventional flash memory is classified as code flash and data flash according to its application. The code flash memory uses a NOR type structure flash memory having a short random access time, and the data flash memory uses a NAND type structure flash memory having a short writing time and a high integrity.

Particularly, NAND type flash memories, which have a high integrity because it is unnecessary to form contacts of source and drain on each cell, have been used mainly as large capacity storages in portable disks, digital cameras, video recorders, audio recorders and so on. As times have gone by, demands for NAND type flash memories have been increased.

Therefore, a reduction in cell size and electrical power consumption and a high speed operation have been needed to meet an increase in consumption for NAND flash memories.

Up to now, attempts to promote the degree of integrity of NAND flash memory arrays have been focused mainly on the reduction in cell size, based on planar structure. As a result from such attempts having problems with cell operation, there have been some limitations in improving integrity degree.

Therefore, manufacturers pass over memory arrays having conventional planar structures like FIG. 1, and try rather to develop memory arrays having three-dimensional structures, in which embody memory cells by forming trenches on a silicon substrate and using sidewalls of the trenches.

The memory arrays having three-dimensional structures, as shown in FIG. 2, embody word lines on sidewalls as if one crushed the memory array having conventional planar structures into folded array. The three-dimensional structure enables to reduce required areas of total array to a great amount and produce high integrity.

The representative prior arts using the three-dimensional structure were described in U.S. Pat. No. 6,878,991 B1 and Korean patent number 777016 of the same inventors of the present invention.

The latter had an advantage of putting the former invention to practical use, however, as shown in FIG. 3, it should still form a control gate 150 in each cell and has limitation in improving integrity degree.

SUMMARY OF THE INVENTION

Technical Problem

To solve the problem, the present invention is directed to a NAND flash memory array, methods for operating and fabricating the same, wherein the NAND flash memory array enables to reduce area for separating conventional control gates by forming one control gate (i.e., a shared word line) between two cells having vertical channels in a folded three-dimensional pillar structure, and a cut-off gate line under the control gate respectively, and it enables to operate each cell independently by the cut-off gate line.

Technical Solution

To achieve the objective of the present invention, a NAND flash memory array is characterized by including a plurality of bit lines formed with a plurality of silicon square pillars of specific height being in a row at specific intervals on a silicon substrate respectively, and filled with a plurality of insulating square pillars between silicon square pillars in a vertical direction with the bit lines to form a plurality of trenches having same width as the each specific interval, a plurality of cut-off gate lines formed in the lower part of the each trench, wherein a first insulating layer is placed between the each cut-off gate line and the each trench; a second insulating layer formed at the exposed parts of the each silicon square pillar and the each cut-off gate line; a plurality of charge storage layers formed over both side walls of the each silicon square pillar, wherein the second insulating layer is placed between the side wall and the charge storage layer; a third insulating layer formed on the upper part of the each charge storage layer and at the exposed parts of the second insulating layer; and a plurality of word lines formed on the upper part of the third insulating layer, filling up the each trench, wherein the upper part of the each silicon square pillar is doped with specific impurities and functions as a source or a drain.

Here, one end of the each bit line is connected to a common source line through one of a plurality of first selective transistors, and the other end of the each bit line is connected to a power supply line through one of a plurality of second selective transistors, and a gate of the each first selective transistor is connected electrically to one of a plurality of first selective lines, and a gate of the each second selective transistor is connected electrically to one of a plurality of second selective lines.

A method for operating a NAND flash memory array of the present invention is characterized by programming one of two memory cells first which formed at the site where one of the bit lines and one of the word lines cross each other by applying an appropriate bias voltage to the common source line, the power supply line, the each first selective line, the each second selective line, the each bit line, the each word line, the each cut-off gate line and the silicon substrate, respectively, and programming the other cell by changing the bias voltage condition.

A method for fabricating a NAND flash memory array, comprises a first step of carrying out an ion injection process for forming a source or drain region on a prepared silicon substrate; a second step of coating a photoresist on the upper part of the substrate and patterning the photoresist in a direction of bit line; a third step of forming a silicon fin by using the photoresist pattern as a mask and etching a silicon in the substrate; a fourth step of depositing an insulating material on a whole surface of the substrate, and etching the insulating material to be left only between the silicon fins; a fifth step of coating a photoresist on the upper part of the substrate and patterning the photoresist in a direction of word line; a sixth step of forming a plurality of trenches by using the photoresist pattern as a mask, etching the exposed silicon fin and the exposed insulating material one after the other; a seventh step of forming a first oxide layer on a whole surface of the substrate or on the exposed silicon surface; an eighth step of forming a plurality of cut-off gate lines by depositing metal or silicon-like material on a whole surface of the substrate and etching the metal or silicon-like material to be left only in portion of the low part of the each trench; a ninth step of leaving the first oxide layer only in both sides and low part of the cut-off gate line by removing the first oxide layer exposed by etching the metal or silicon-like material; a tenth step of forming a second oxide layer on a whole surface of the substrate, the exposed silicon surface, or the exposed silicon-like material surface; an eleventh step of forming a charge storage layer on each side wall by depositing a charge trap dielectric layer on a whole surface of the substrate and etching the charge trap dielectric layer anisotropically; and a twelfth step of forming a plurality of word lines by depositing a third oxide layer on a whole surface of the substrate, further depositing metal or silicon-like material on a whole surface of the substrate, and etching the metal or silicon-like material to be left only in the each trench.

ADVANTAGEOUS EFFECT

The present invention can operate two cells with one word line (i.e., one control gate), and therefore it can reduce area for separating conventional control gates considerably. In the present invention, each cell can be operated independently by cut-off gates. Particularly, the present invention makes a shared cut-off gate turn off during a programming operation and it prevents programming the opposite cell by a self-boosting effect. It is possible to shield electrically with a shared word line during a reading operation, and it enables to minimize the effect of storage condition of the opposite cell.

Also, a NAND flash memory array of the present invention can be fabricated by using the conventional CMOS process.

BRIEF DESCRIPTION OF THE DRAWINGS

The invention may be better understood by the drawings that are briefly described below and attached hereto, in the several figures of which identical reference numbers (if any) refer to identical or similar elements.

In these drawings, the following reference numbers are used throughout: reference number 10 indicates a silicon substrate, 14 means a silicon square pillar, 24 means a source or drain region, 30 and 32 mean a photoresist pattern, 40 and 42 mean a trench, 52 means an insulating square pillar, 60 means a first insulating layer, 72 means a cut-off gate line (cut-off gate), 80 means a second insulating layer, 82 means a third insulating layer, 92 means a side wall charge storage layer, and 102 means a word line (control gate).

DETAILED DESCRIPTION OF THE PREFERRED EMBODIMENTS

A detailed description of preferred embodiments of the present invention is provided below with respect to the accompanying drawings.

[First Embodiment of an Array Structure]

Figure 1:
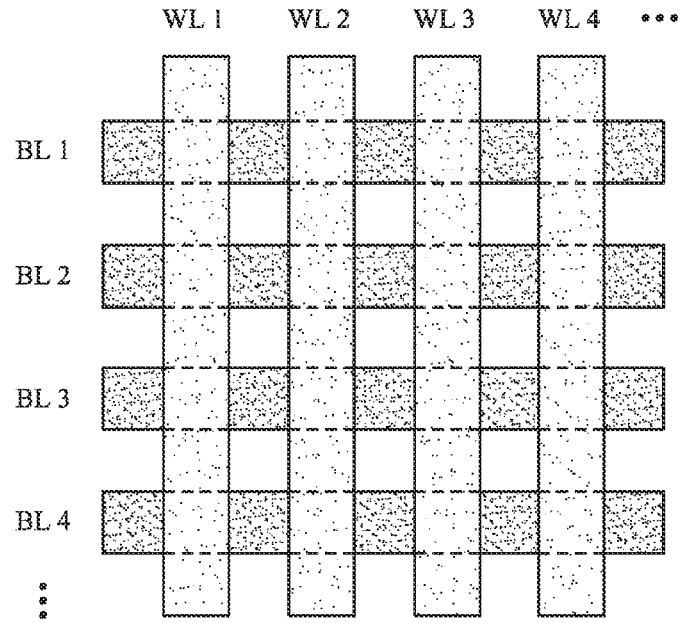
FIG. 1 is a layout of a conventional planar NAND flash memory array.
Figure 2:
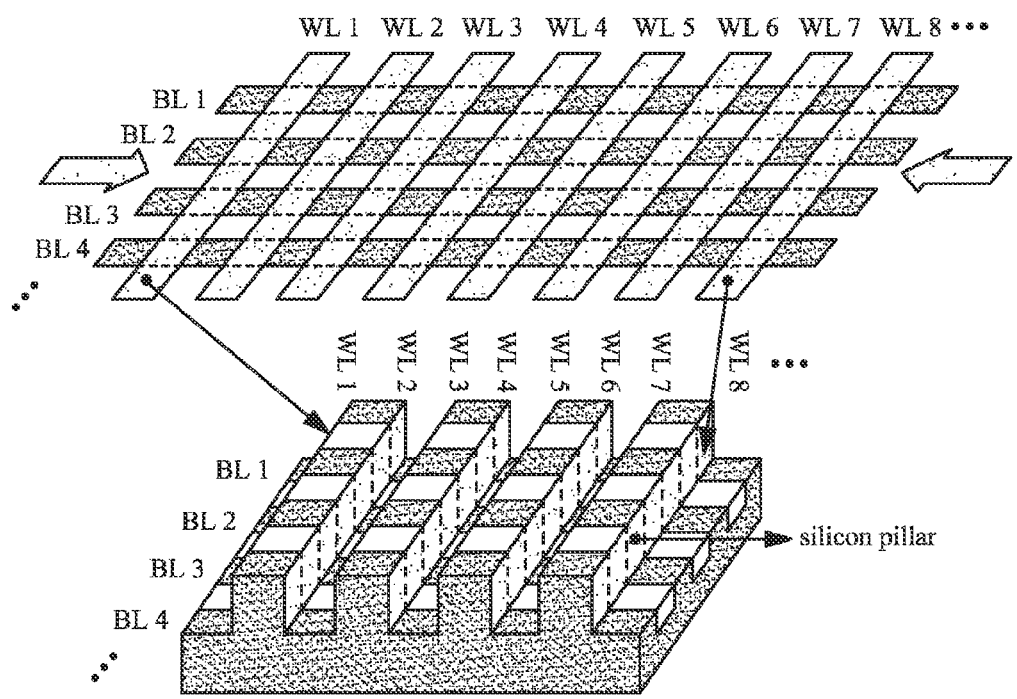
FIG. 2 is a conceptual comparative diagram of a conventional planar array and a three-dimensional array of the present invention.
Figure 3:
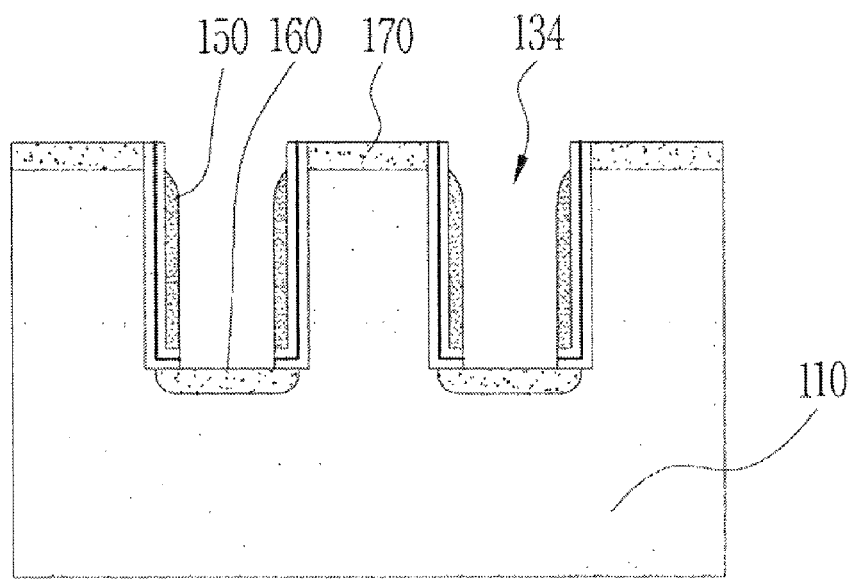
FIG. 3 is a cross-section of a conventional memory array of Korean Patent Registration No. 777016.
Figure 4A:
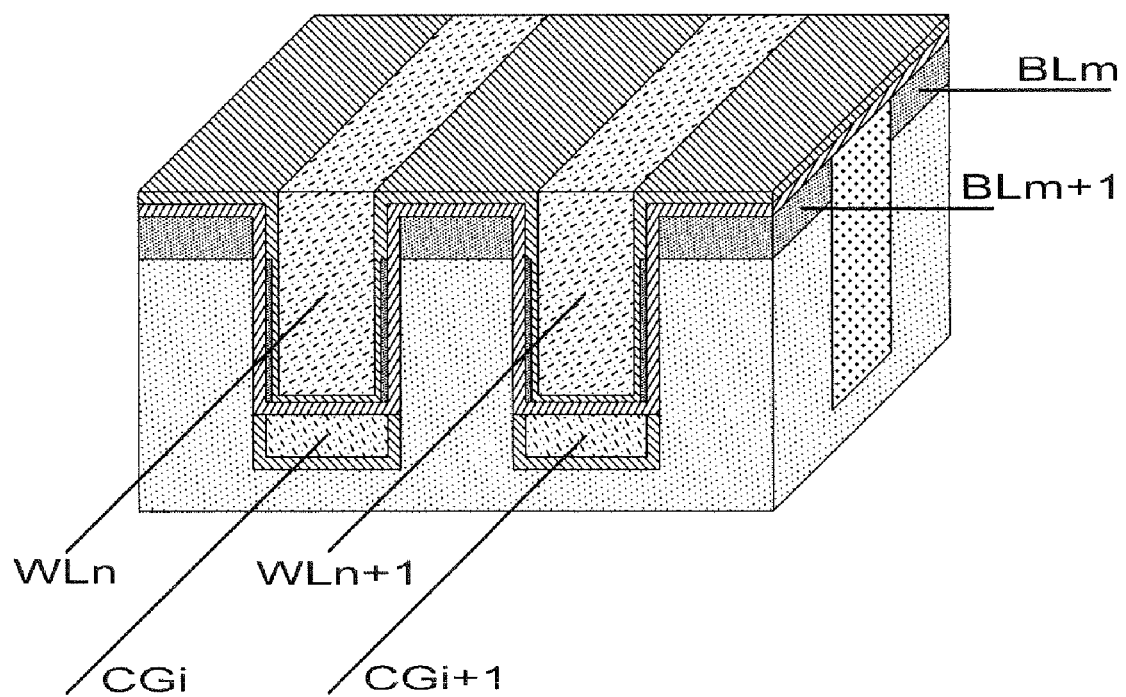
FIGS. 4a and 4b are a conceptual diagram of array structure and a cross-section of one embodiment of the present invention, respectively.
Figure 9B:
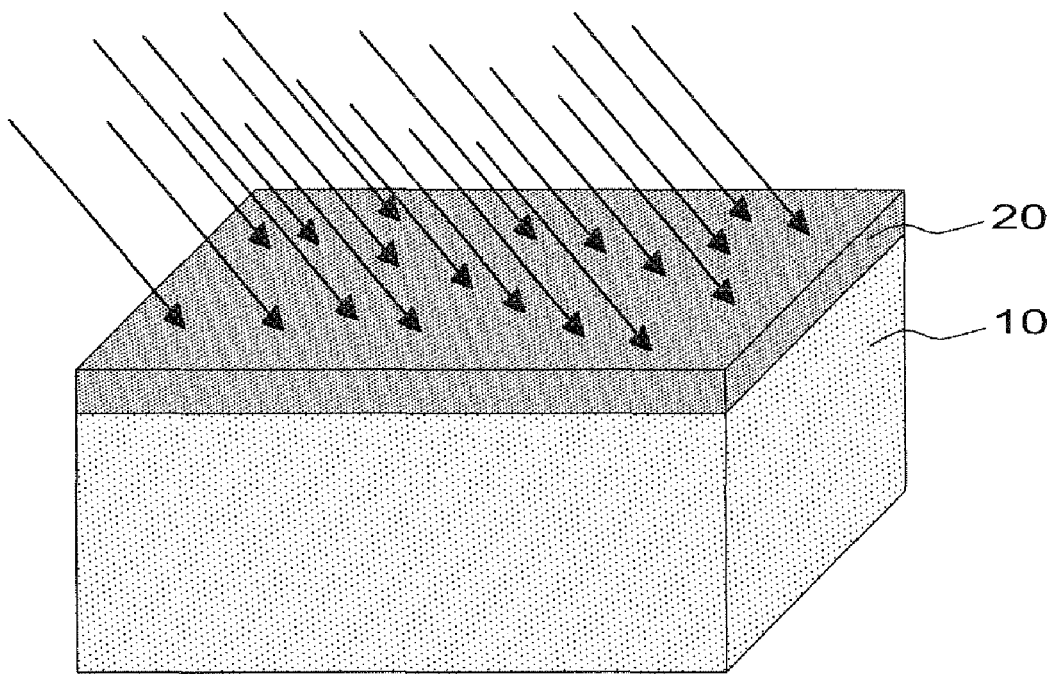
Figure 9C:
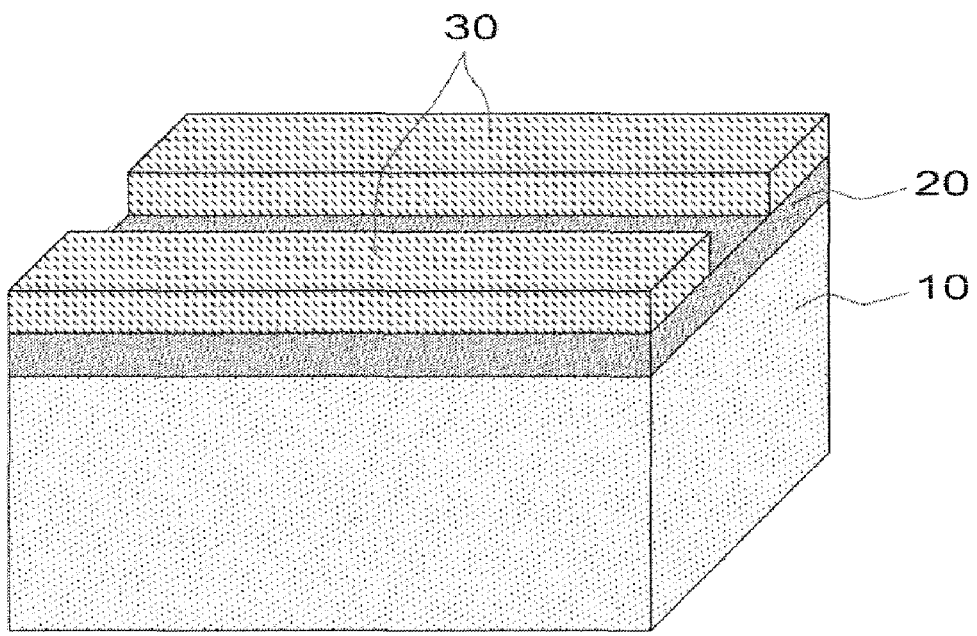
Figure 9D:
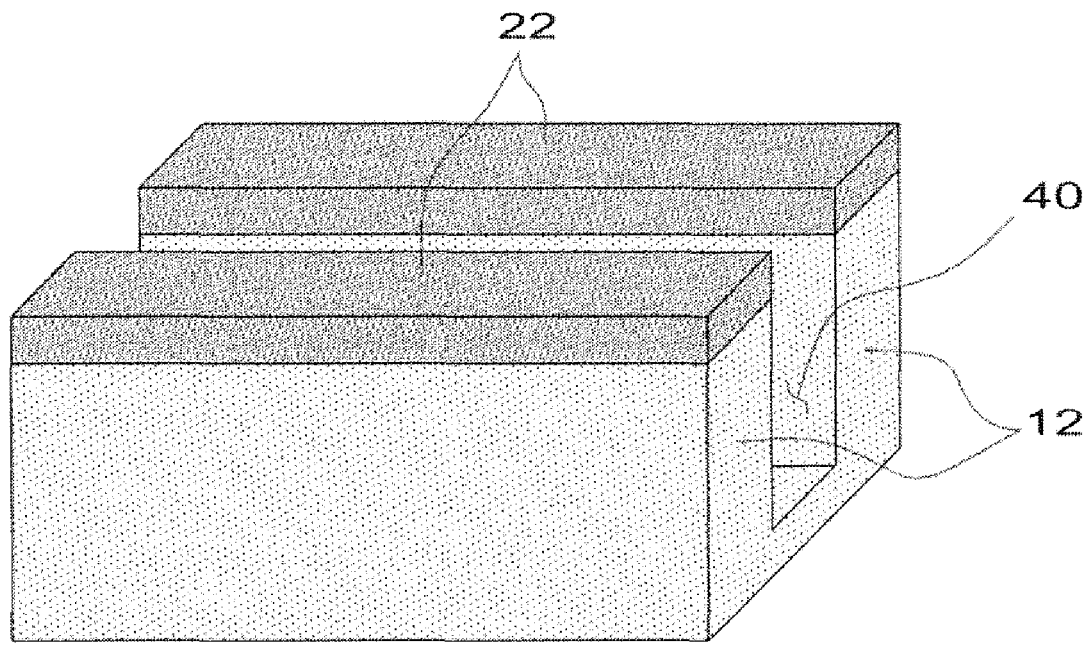
Figure 9E:
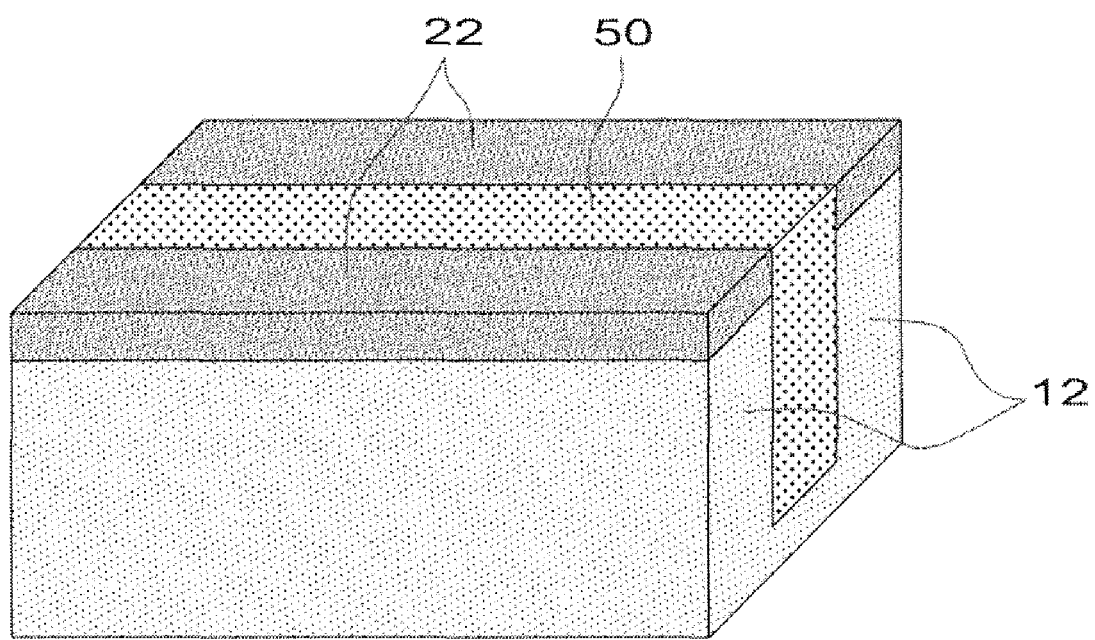
Figure 9F:
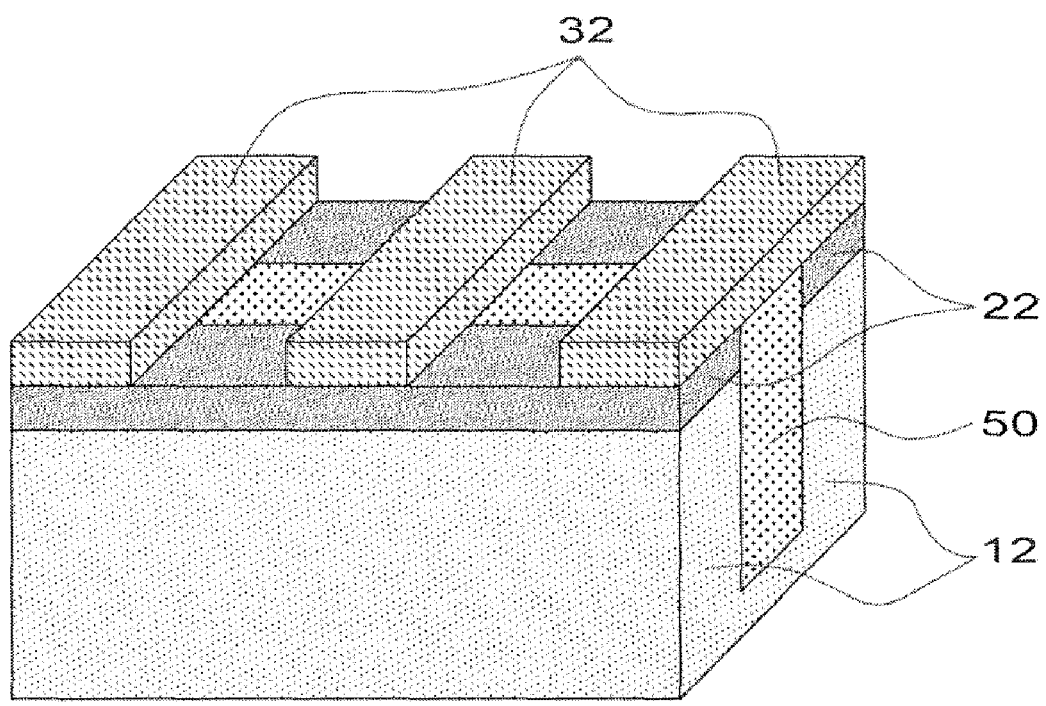
Figure 9G:
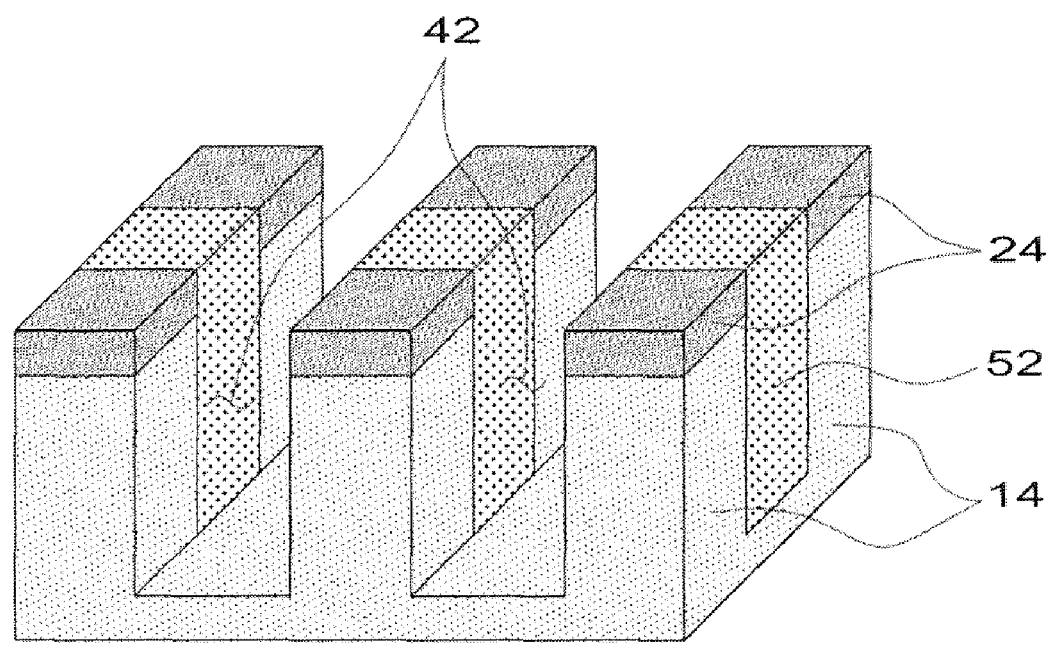
Figure 9H:
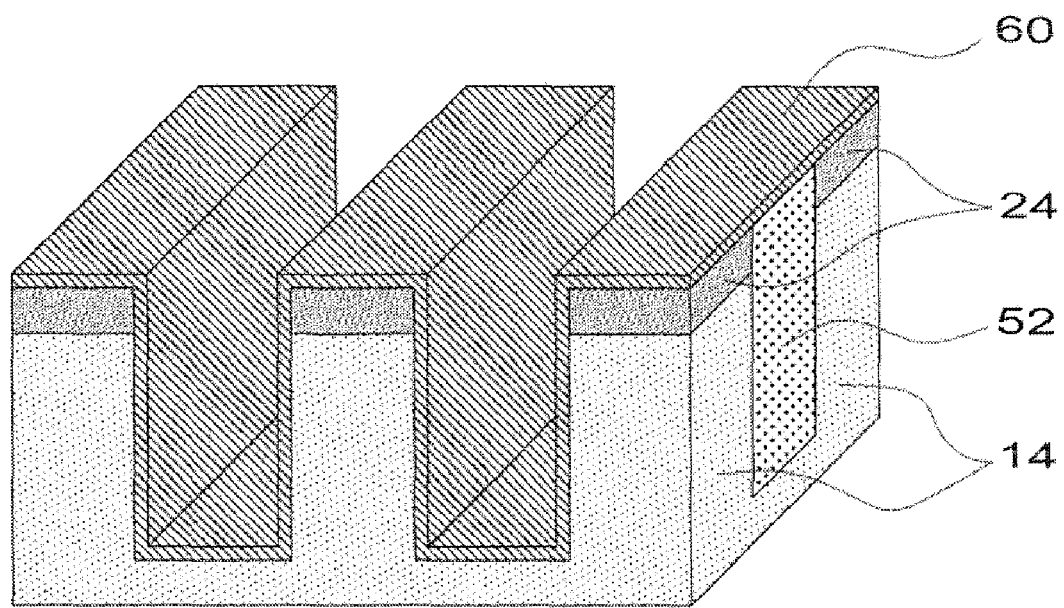
Figure 9I:
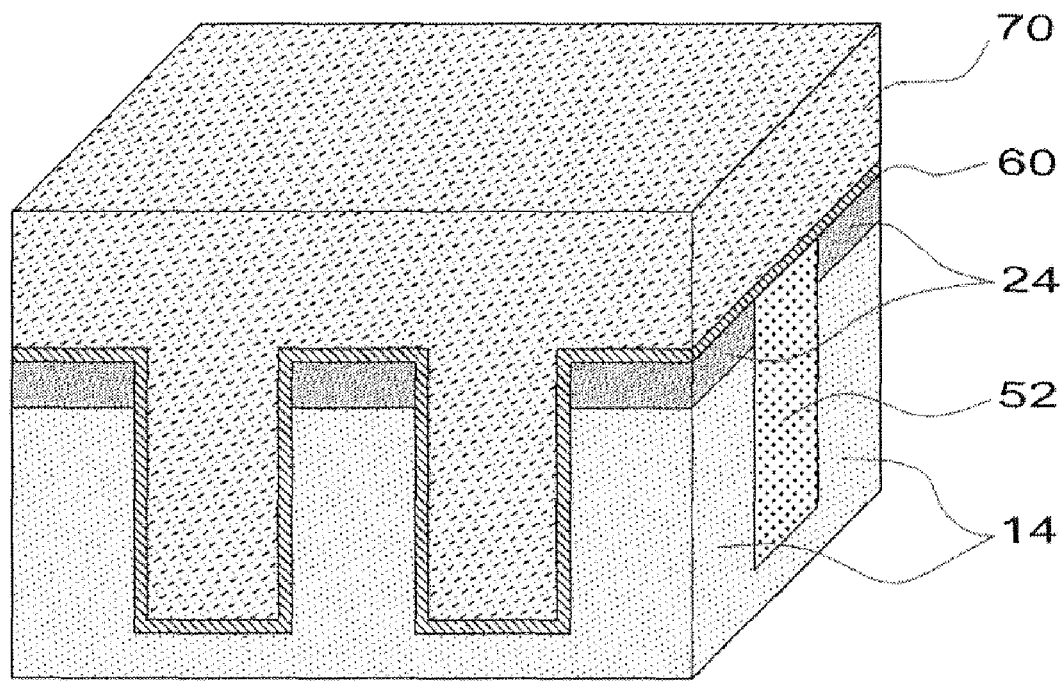
Figure 9J:
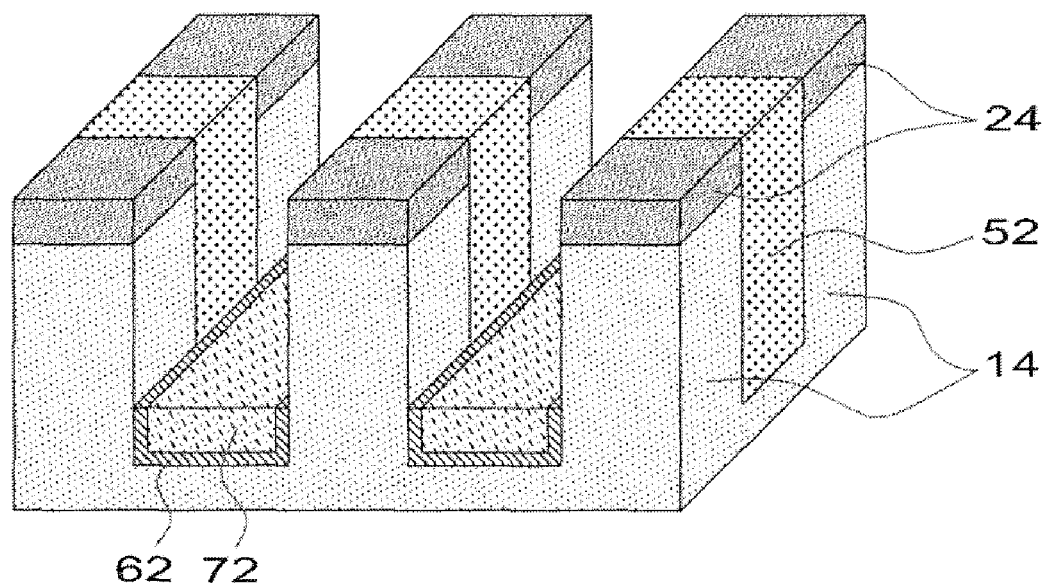
Figure 9K:
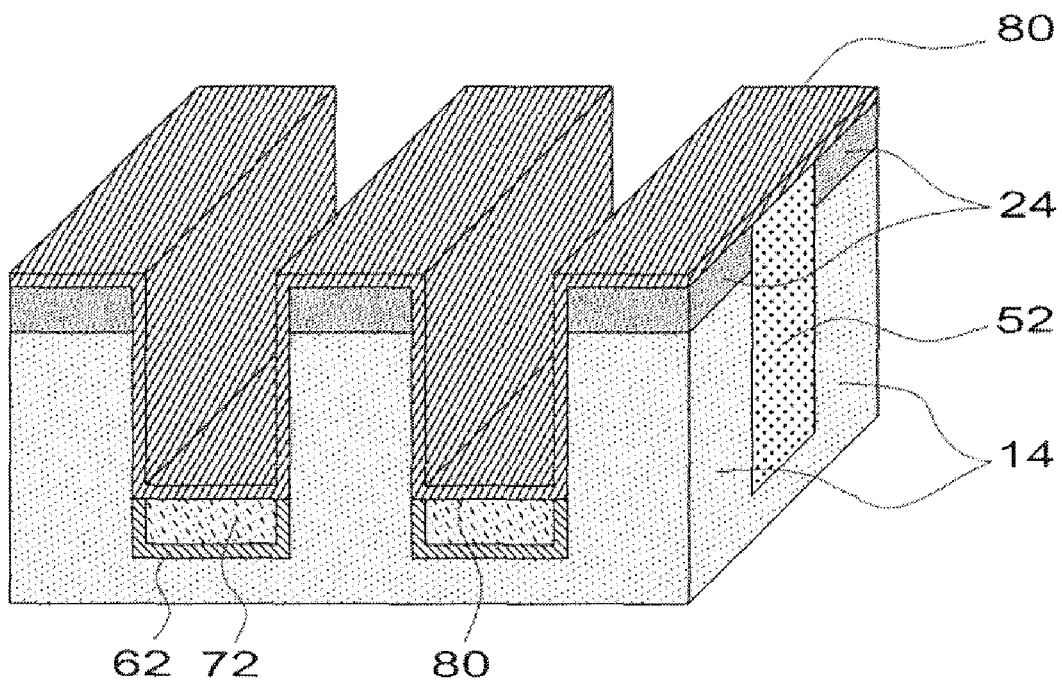
Figure 9L:
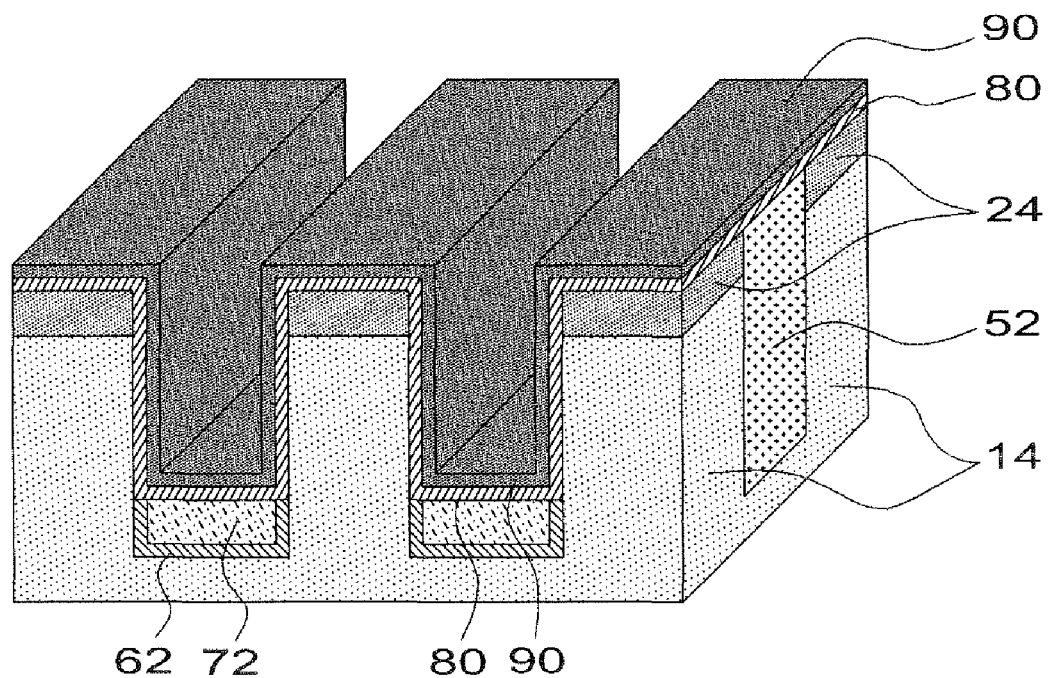
Figure 9M:
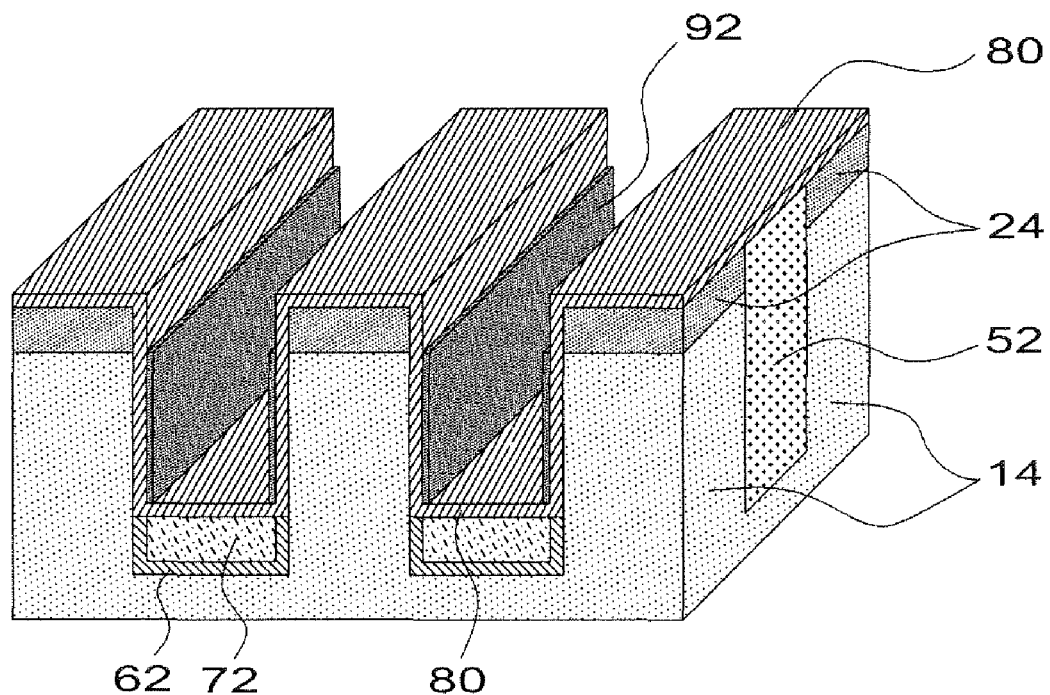
Figure 9N:
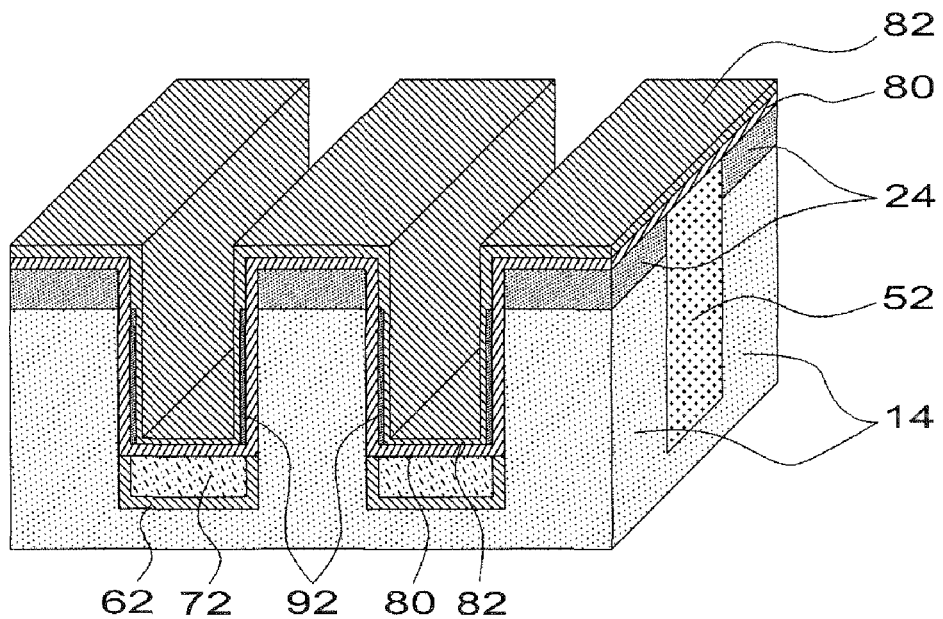
Figure 9O:
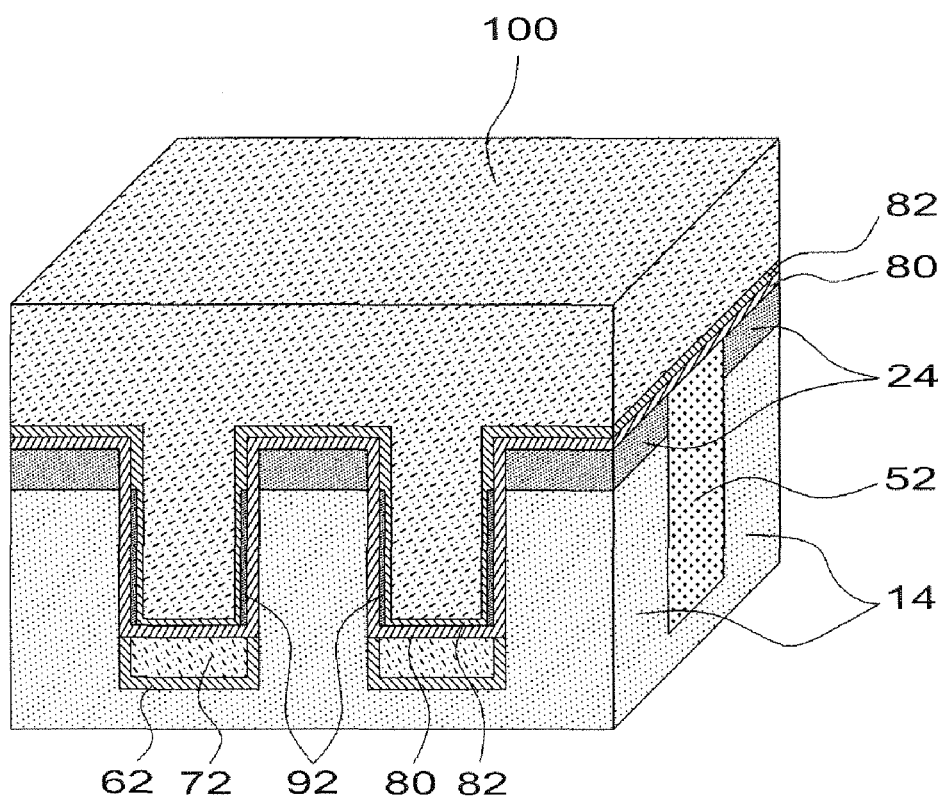
Figure 9P:
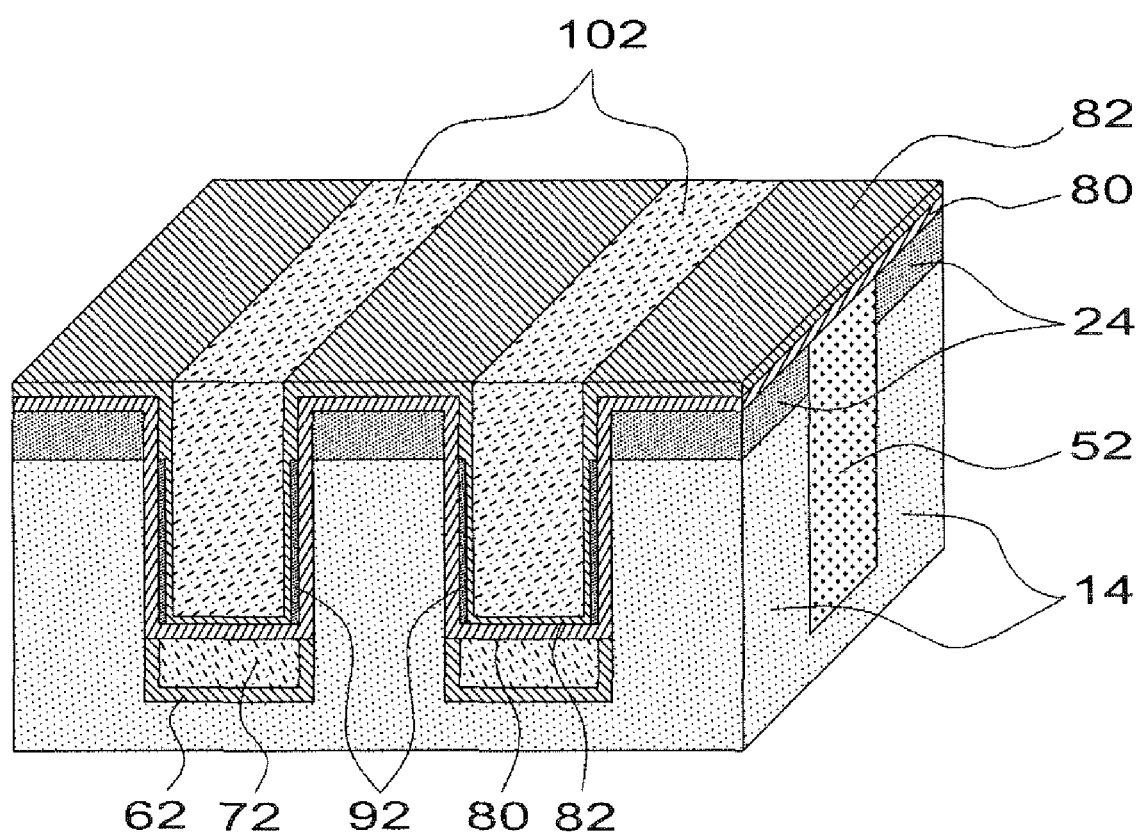

A NAND flash memory array of the present invention comprises basically a plurality of bit lines 24 ($BL_m$, $BL_{m+1}$) formed with a plurality of silicon square pillars 14 of specific height being in a row at specific intervals on a silicon substrate 10, respectively, and filled with a plurality of insulating square pillars 52 between silicon square pillars 14 in a vertical direction with the bit lines to form a plurality of trenches 42 having same width as the each specific interval, a plurality of cut-off gate lines 72 ($CG_i$, $CG_{i+1}$) formed in the lower part of the each trench 42, wherein a first insulating layer 62 is placed between the each cut-off gate line and the each trench; a second insulating layer 80 formed at the exposed parts of the each silicon square pillar 14 and the each cut-off gate line 72; a plurality of charge storage layers (92; 92a to 92f) formed over both side walls of the each silicon square pillar, wherein the second insulating layer is placed between the side wall and the charge storage layer; a third insulating layer 82 formed on the upper part of the each charge storage layer and at the exposed parts of the second insulating layer; and a plurality of word lines 102 ($WL_n$, $WL_{n+1}$) formed on the upper part of the third insulating layer, filling up the each trench, wherein the upper part 24 of the each silicon square pillar 14 is doped with specific impurities and functions as a source or a drain, as shown in FIGS. 4a, 9g and 9p.

Therefore, the differences between this embodiment and the conventional invention of Korean Patent No. 777016 are as follows: control gates (i.e., word lines) are not separated, and two cells can be operated with one word line, a source or drain 24 exists only in the upper part of a square pillar shape active region, and a separate cut-off gate (CG) of general MOSFET structure exists and so on.

From those differences, parting space between control gates which is required in the conventional invention of Korean Patent No. 777016 becomes unnecessary, and therefore, this invention has advantages that required area can be reduced considerably, and independent operation of each cell is possible by controlling a control gate 72.

The control gate 72, as shown in FIG. 9p, is located under a control gate 102 and it is possible to embody an array without any area loss.

[Second Embodiment of an Array Structure]

Figure 4B:
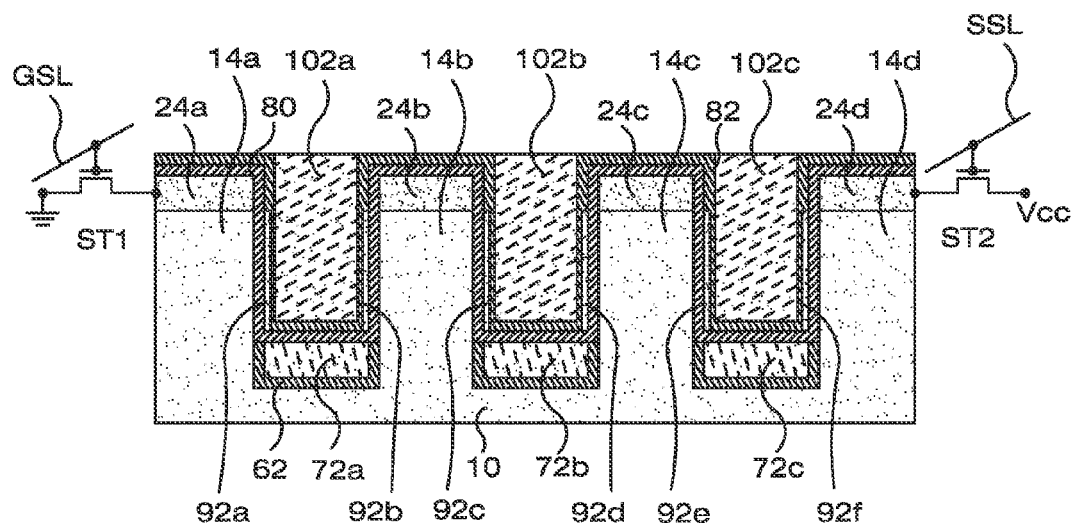

First embodiment of an array structure can be embodied more specifically. As shown in FIG. 4b, one end 24a of the each bit line is connected to a common source line (not shown in Fig.) through one (ST1) of a plurality of first selective transistors, and the other end 24d of the each bit line is connected to a power supply line (not shown in Fig.) through one (ST2) of a plurality of second selective transistors, a gate of the each first selective transistor is connected electrically to one (GSL) of a plurality of first selective lines, and a gate of the each second selective transistor is connected electrically to one (SSL) of a plurality of second selective lines.

The second insulating layer 80, as shown in FIG. 9k, can be formed even at the exposed part of the each insulating square pillar 52.

The each charge storage layer 92 is made up with insulating material which has a charge trapping characteristic.

Here, it is preferable that the insulating material which has a charge trapping characteristic comprises nitride or other charge trapping material, such as nano-crystal, high dielectric material having a plurality of traps and so on. It is why large quantity of deep level trap in a charge trap layer can be used for charge storage, and according to isolated trap characteristic of the charge trap layer, electrons injected during a programming operation hardly move laterally, and electrons distribute over the site where electrons are injected mainly, and the condition can be maintained. As a result, electrical isolation between neighboring cells can be carried out automatically.

The first insulating layer 62, the second insulating layer 80 and the third insulating layer 82 can be an oxide layer, and therefore, when the three insulating layers are formed adjacent, it can be made to be seen as one oxide layer.

[Third Embodiment of an Array Structure]

In a first embodiment of an array structure, the each charge storage layer 92 can be made up with a conductive layer to make a floating gate structure. This embodiment has a demerit that the charge storage layer 92 should be cut physically in order to isolate neighboring cells electrically.

The conductive layer can be silicon-like material (polysilicon, amorphous silicon, etc.) doped with impurities as well as metal.

[First Embodiment of an Array Operating Method]

First, a method for programming a NAND flash memory array of the second embodiment of an array structure, is characterized by programming one of two memory cells first which formed at the site where one of the bit lines and one of the word lines cross each other by applying an appropriate bias voltage to the common source line, the power supply line, the each first selective line, the each second selective line, the each bit line, the each word line, the each cut-off gate line and the silicon substrate, respectively, and then programming the other cell by changing the bias voltage condition.

More specifically, as shown in FIG. 4b, in order to program one memory cell toward the common source line (not shown in Fig.) in the two memory cells operated by the word line 102b by injecting electrons into the charge storage layer 92c, the common source line is grounded, a voltage Vcc is applied to the power supply line, respectively, a voltage which is higher than a threshold voltage of a first selective transistor (ST1) is applied to one (GSL) of the first selective lines in order to turn on only the first selective transistor (ST1) connected to one end of a bit line passing the two cells desired to be programmed (the other first selective lines are applied in order to turn off the rest of the first selective transistors), a program voltage $V_{PGM}$ is applied to the word line 102b passing the two cells among the word lines in order to generate Fowler-Nordheim tunneling, a voltage $V_{PASS}$, which is lower than the program voltage $V_{PGM}$ and is only to form a channel in each cell, is applied to the other word lines (102a, 102c, and so on), a low voltage $V_{LOW}$, which is not to form a channel in a lower silicon contacting with the first insulating layer 62, is applied to one cut-off gate line 72b located under the two cells among the cut-off gate lines, a high voltage $V_{HIGH}$, which is to form a channel, is applied to the other cut-off gate lines (72a, 72c, and so on), and therefore, the left cell of the word line 102b in FIG. 4b is programmed.

Then, in order to program the other cell (the right cell of the word line 102b in FIG. 4b) toward the power supply line in the two cells desired to be programmed, bias voltages are applied by applying a voltage $V_{CC}$ to the common source line and grounding the power supply line, a voltage which is higher than a threshold voltage of a second selective transistor (ST2) is applied to the second selective line (SSL) in order to turn on only the second selective transistor ST2 connected to the other end 24d of the bit line passing the two cells desired to be programmed, a bias voltage is applied to the word lines and to the cut-off gate lines, respectively, with the same condition as the case to program the opposite cell (the left cell of the word line 102b in FIG. 4b).

When programming one cell toward the common source line in the two cells desired to be programmed, which is the left cell of word line 102b in FIG. 4b, a voltage, which is same to or higher than a voltage $V_{CC}$, is applied to the each second selective line (SSL) in order to turn on the each second selective transistor (ST2). And, when programming the other cell toward the power supply line in the two cells desired to be programmed, which is the right cell of word line 102b in FIG. 4b, a voltage, which is same to or higher than a voltage $V_{CC}$, is applied to the each first selective line (GSL) in order to turn on the each first selective transistor (ST1). It is preferable to float the silicon substrate 10 in the both two cases.

In a method for programming a NAND flash memory array of this embodiment, a channel is not formed under the cut-off gate line 72b by applying a low voltage to the cut-off gate line 72b located under the cells desired to be programmed, so that a method for programming of this embodiment is characterized by not programming a neighboring cell which shares a word line during a programming operation by floating the cell desired not to be programmed from the ground.

Therefore, even if an enough high program voltage is applied to the shared word line 102b, the cell at which a channel has been formed by getting electron supply can be programmed, on the other hand, the cell on the other side (i.e., the opposite cell), which has not got electron supply from the ground due to a channel blocking by the cut-off gate line 72b, can not be programmed.

Of course, even if some channel of the opposite cell has been formed by getting electron supply from a drain 24c by a program voltage of the shared word line 102b, as far as the opposite cell is in a floating state by the cut-off from the ground by the cut-off gate line 72b, due to the self-boosting effect, the electron potential of the channel of the opposite cell is influenced by a program voltage of the word line 102b and goes up. As a result, electrons in the channel cannot be injected into a charge storage layer 92d of the opposite cell, and therefore, the opposite cell cannot be programmed.

In the meantime, non-selective bit lines can be floated respectively by turning off first selective transistors and/or second selective transistors, so that it can be prevented to program cells which are undesired to be programmed due to the self-boosting effect.

Figure 5:
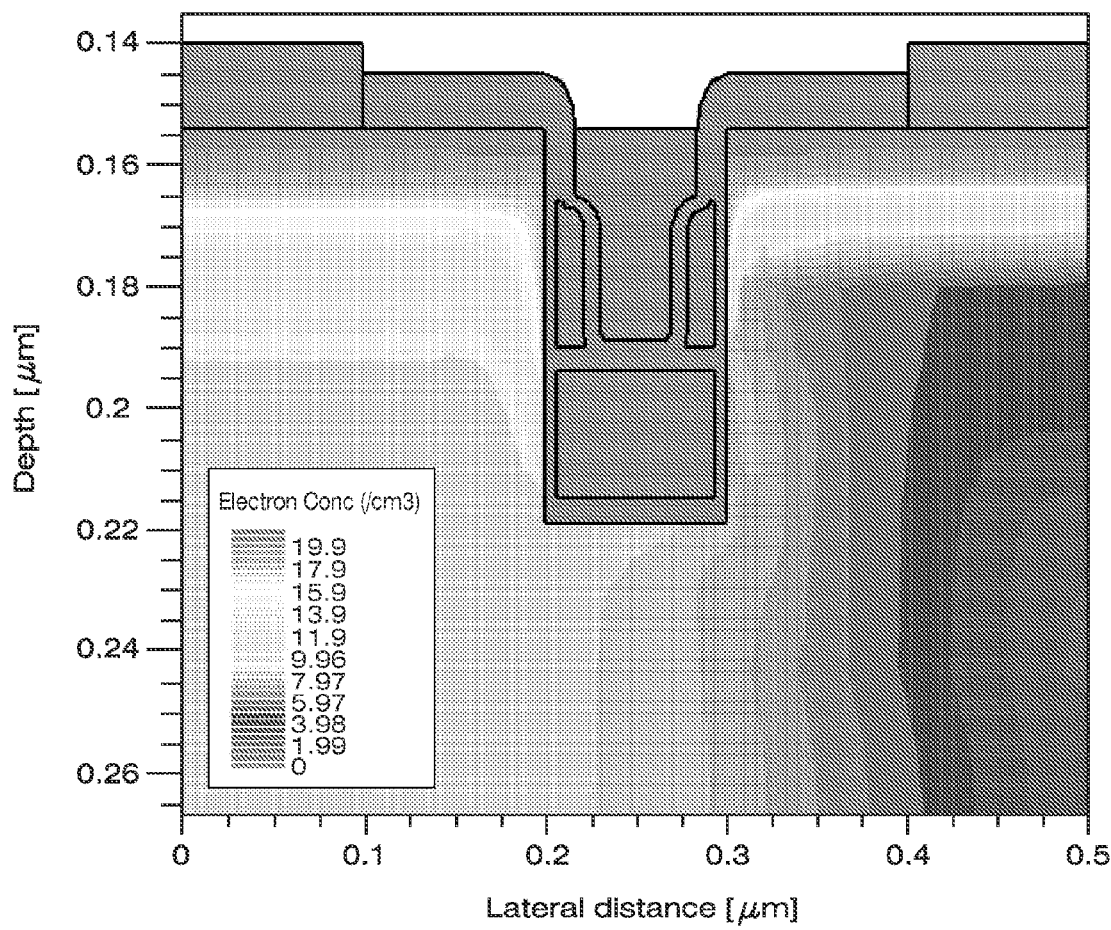
FIG. 5 is a diagram of a simulation result showing a different electron distribution pattern in both sides of a trench when a cut-off gate is turned off according to one embodiment of the present invention.

FIG. 5 is a diagram of a simulation result showing a different electron distribution pattern in both sides of a trench when a cut-off gate is turned off. FIG. 5 shows that electrical connection between two cells can be blocked effectively by a cut-off gate.

[Second Embodiment of an Array Operating Method]

Next, the first embodiment of operating method for a NAND flash memory array of the second embodiment of an array structure, is further characterized by erasing memory cells of a block to be connected to a word line passing a specific cell at a time by grounding the word line passing the specific cell to erase information and the cut-off gate line passing under the word line, floating the other lines, and applying a voltage, which is high enough to pull out electrons from a charge storage layer of the specific cell or to inject holes from a channel region of the specific cell to the charge storage layer of the specific cell, to the silicon substrate.

Because the method for erasing can be embodied satisfactorily by the above explanation, its detailed explanation is omitted.

[Third Embodiment of an Array Operating Method]

In the meantime, the first embodiment of operating method for a NAND flash memory array of the second embodiment of an array structure, is further characterized by reading information of a specific cell by applying a proper bias voltage respectively to the common source line, the power supply line, the each first selective line, the each second selective line, the each bit line, the each word line, the each cut-off gate line and the silicon substrate to turn on only the first selective transistor and the second selective transistor connected to both ends of a bit line passing the specific cell desired to be read information, and measuring current which flows from the power supply line to the common source line on a specific standard voltage applied to a word line passing the specific cell.

Here, it is more preferable that reading information of the specific cell is by changing a bias voltage condition of the common source line and the power supply line, further measuring current flowing from the common source line to the power supply line on the specific standard voltage applied to the word line passing the specific cell, and comparing the measured current with the current flowing in the opposite direction.

Figure 6:
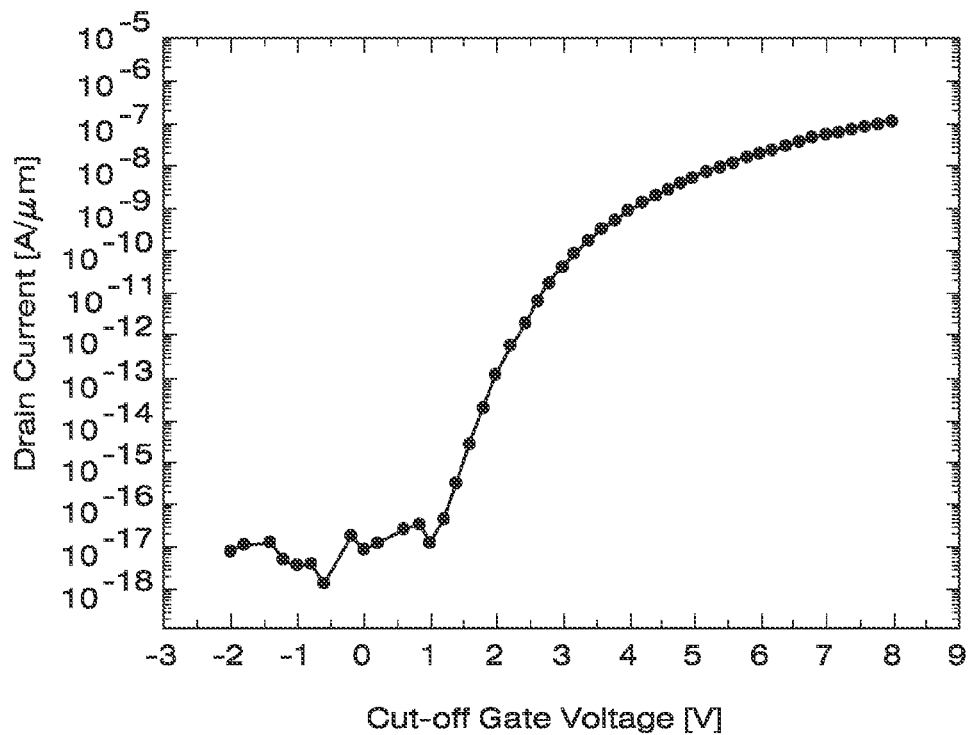
FIG. 6 shows a voltage-current characteristic for a cut-off gate of one embodiment of the present invention.

The experimental example to support this embodiment is as follows;

After forming a channel at a basic array shown in FIG. 5 by applying enough high voltage to a word line, we measured changes in drain current according to changes in a cut-off gate voltage and obtained the result of FIG. 6.

From FIG. 6, when the cut-off gate voltage at the drain current of $10^{-7}$ A/μm is regarded as a threshold voltage of the cut-off gate, the threshold voltage of the cut-off gate was about 6V.

Based on that, in order to examine a voltage-current characteristic for a control gate depending whether each cell is programmed or not, when "1" stands for the programmed state and "0" stands for the erased state, we can express states of two cells sharing a control gate as 00, 01, 10, 11.

Figure 7:
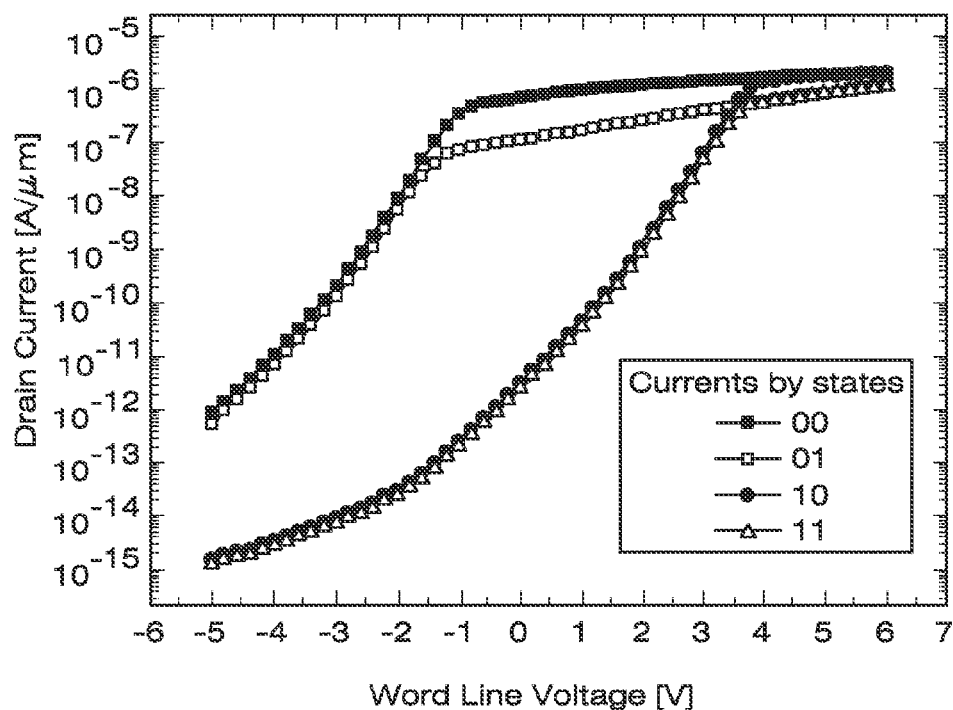
FIG. 7 shows a voltage-current characteristic for a cut-off gate according to each storage condition of one embodiment of the present invention.

Therefore, we examined a voltage-current characteristic for a word line, i.e., a control gate voltage, at the four states when the cut-off gate was turned on, and got a result of FIG. 7.

The result of FIG. 7 was obtained by carrying out only a forward reading operation for the four storage states. However, because the basic array is bisymmetric, in a backward reading operation, the results for states of "00" and "11" are same with the results in a forward reading operation, and the result for state of "01" in a backward reading operation is same with the result for state of "10" in a forward reading operation. Of course, the result for state of "10" in a backward reading operation is same with the result for state of "01" in a forward reading operation.

Because when a source is connected to the left and a drain is connected to the right at the basic array, as shown in FIG. 5, the influence on the current is larger when electrons are stored in a charge storage layer at a source side rather than at a drain side, we anticipated that state of "10" rather than state of "00", and state of "11" rather than state of "01" showed lower current, and we confirmed that from FIG. 7.

The result of FIG. 7 shows that when the left storage state is maintained and the right storage state is changed, in words, from "00" to "01", or, from "10" to "11", a threshold voltage hardly changes, and only on-current becomes a little bit different. From this, we found that mutual electrical interference can be effectively screened because a control gate (a word line) of n⁺ doped poly-silicon exists in the middle of the basic array in FIG. 5. This characteristic is urgently required in three dimensional arrays in which interval between neighboring cells sharing a word line becomes narrow.

Figures 8, 9A:
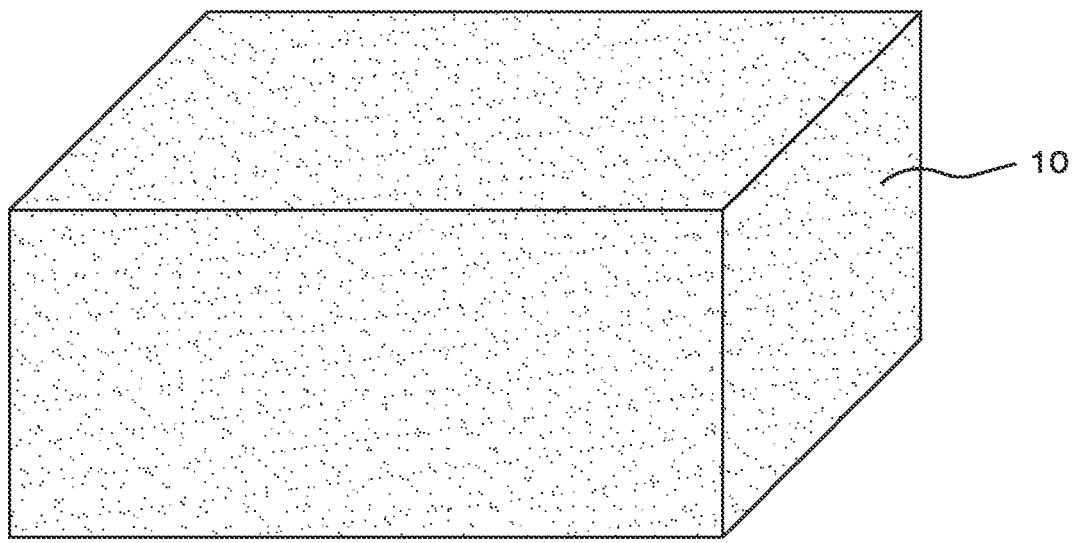
FIG. 8 is a table of voltage condition showing one example of a method for operating a memory array of the present invention.
FIGS. 9a to 9p are conceptual process perspective views showing one example of a method for fabricating a memory array of the present invention.

FIG. 8 is a table of summarizing the first to third embodiments of an operating method of the present invention.

FIG. 8 was depicted considering FIG. 4b, and WL1 is applicable to 102a, WL2 is applicable 102b, WL3 is applicable to 102c, CG1 is applicable to 72a, CG2 is applicable to 72b, CG3 is applicable to 72c, Source is applicable to 24a, Drain is applicable to 24d, and Substrate is applicable to 10.

[Embodiment of an Array Fabricating Method]

This relates to a method for fabricating an array to materialize the first to third embodiments of an array structure, and undergoes several steps like FIGS. 9a to 9p. Detailed description is as follows;

First, after a silicon substrate 10 preparing, as shown in FIG. 9a, an ion injection process for forming a source or drain region 20 in the prepared silicon substrate 10 is carried out, as shown in FIG. 9b (a first step).

Then, as shown in FIG. 9c, a photoresist is coated on the upper part of the substrate 10, and patterning the photoresist is carried out in a direction of bit line (a second step).

Next, as shown in FIG. 9d, silicon fins 12 are formed by using the each photoresist pattern 30 as a mask and etching the silicon in the substrate (a third step). Here, the silicon fins 12 are formed at least as many as the number of bit lines, and a trench 40 is formed between the silicon fins 12.

Then, as shown in FIG. 9e, an insulating material 50 is deposited on a whole surface of the substrate, and etched the insulating material to be left only between the silicon fins 12 (a fourth step).

Next, as shown in FIG. 9f, a photoresist is coated on the upper part of the substrate, and patterning the photoresist is carried out in a direction of word line (a fifth step).

Then, as shown in FIG. 9g, a plurality of trenches are formed by using the each photoresist pattern 32 as a mask and etching the exposed silicon fins 12 and 22 and the exposed insulating material 50 one after the other (a sixth step).

Next, as shown in FIG. 9h, a first oxide layer 60 is formed on a whole surface of the substrate or on the exposed silicon surface (a seventh step).

Here, the first oxide layer 60 becomes an insulating layer of a cut-off gate line later. When forming the first oxide layer 60 on the whole surface of the substrate, it is preferable to use a CVD process. When forming the first oxide layer 60 only on the exposed silicon surface, it is preferable to use a furnace or RTO and the like for a thermal oxidation.

Next, as shown in FIG. 9i, metal or silicon-like material (poly-silicon, amorphous silicon and so on, 70) is deposited on a whole surface of the substrate, and as shown in FIG. 9j, etching the metal or silicon-like material 72 to be left only in portion of the low part of the each trench is carried out (an eighth step). Here, when using silicon-like material, it is preferable to add an impurity injection process during the depositing process or after the etching process. By doing this, a plurality of cut-off gate lines 72 are formed at the low part of the each trench.

Next, the first oxide layer 60 exposed by etching the metal or silicon-like material 70 is removed, and as shown in FIG. 9j, the first oxide layer 62 is left only in both sides and low part of the cut-off gate line 72 (a ninth step).

Then, as shown in FIG. 9k, a second oxide layer 80 is formed on a whole surface of the substrate, the exposed silicon surface, or the exposed silicon-like material surface (a tenth step).

This is to use the second oxide layer 80 as a tunneling oxide layer of each cell, and it is preferable to use a thermal oxidation process rather than a CVD process.

Next, as shown in FIG. 9l, a charge trap dielectric layer 90, for example, a nitride layer, is deposited on a whole surface of the substrate, and etching the charge trap dielectric layer anisotropically is carried out to form a charge storage layer 92 on each side wall (an eleventh step).

Finally, as shown in FIG. 9n, a third oxide layer 82 is deposited on a whole surface of the substrate using such a CVD process to form a blocking oxide layer of each cell, then, as shown in FIG. 9o, metal or silicon-like material 100 is deposited on a whole surface of the substrate using such a CVD process. And then, as shown in FIG. 9p, etching the metal or silicon-like material 100 to be left only in the each trench is carried out to form a plurality of word lines 102 (the twelfth step).

Here, the silicon-like material is poly-silicon or amorphous silicon, and in case that a plurality of the word lines 102 are formed with poly-silicon or amorphous silicon, it is preferable to add an impurity injection process during the depositing process or after the etching process.

And otherwise, the each process according to this embodiment is the same as the conventional CMOS process, and detailed description for this is omitted.

What is claimed is:

1. A NAND flash memory array, comprising:
    a plurality of bit lines formed with a plurality of silicon square pillars of a specific height being in a row at specific intervals on a silicon substrate respectively, and filled with a plurality of insulating square pillars between silicon square pillars in a vertical direction with the bit lines to form a plurality of trenches having same width as the each specific interval;
    a plurality of cut-off gate lines formed in the lower part of the each trench, wherein a first insulating layer is placed between the each cut-off gate line and the each trench;
    a second insulating layer formed at the exposed parts of the each silicon square pillar and the each cut-off gate line;
    a plurality of charge storage layers formed over both side walls of the each silicon square pillar, wherein the second insulating layer is placed between the side wall and the charge storage layer;
    a third insulating layer formed on the upper part of the each charge storage layer and at the exposed parts of the second insulating layer; and
    a plurality of word lines formed on the upper part of the third insulating layer, filling up the each trench,
    wherein the upper part of the each silicon square pillar is doped with specific impurities and functions as a source or a drain.

2. The NAND flash memory array of claim 1,
    wherein one end of the each bit line is connected to a common source line through one of a plurality of first selective transistors, and the other end of the each bit line is connected to a power supply line through one of a plurality of second selective transistors,
    wherein a gate of the each first selective transistor is connected electrically to one of a plurality of first selective lines, and
    wherein a gate of the each second selective transistor is connected electrically to one of a plurality of second selective lines.

3. The NAND flash memory array of claim 2,
    wherein the second insulating layer is formed even at the upper part of the each insulating square pillar.

4. The NAND flash memory array of claim 1,
    wherein the each charge storage layer is made up with insulating material which has an electron-trapping characteristic.

5. The NAND flash memory array of claim 2,
    wherein the each charge storage layer is made up with insulating material which has an electron-trapping characteristic.

6. The NAND flash memory array of claim 3,
    wherein the each charge storage layer is made up with insulating material which has an electron-trapping characteristic.

7. The NAND flash memory array of claim 4,
    wherein the first insulating layer, the second insulating layer and the third insulating layer are an oxide layer.

8. The NAND flash memory array of claim 5,
    wherein the first insulating layer, the second insulating layer and the third insulating layer are an oxide layer.

9. The NAND flash memory array of claim 6,
    wherein the first insulating layer, the second insulating layer and the third insulating layer are an oxide layer.

10. The NAND flash memory array of claim 1,
    wherein the each charge storage layer is made up with a conductive layer.

11. The NAND flash memory array of claim 2,
    wherein the each charge storage layer is made up with a conductive layer.

12. A method for operating a NAND flash memory array of claim 2, characterized by programming one of two memory cells first which formed at the site where one of the bit lines and one of the word lines cross each other by applying an appropriate bias voltage to the common source line, the power supply line, the each first selective line, the each second selective line, the each bit line, the each word line, the each cut-off gate line and the silicon substrate, respectively, and then programming the other cell by changing the bias voltage condition.

13. The method of claim 12, characterized for the purpose of programming one cell toward the common source line in the two cells desired to be programmed,
    by grounding the common source line,
    applying $V_{CC}$ to the power supply line,
    applying a voltage to the first selective line in order to turn on only a first selective transistor connected to one end of a bit line passing the two cells desired to be programmed,
    applying a program voltage $V_{PGM}$ to a word line passing the two cells among the word lines in order to generate Fowler-Nordheim tunneling,
    applying a voltage $V_{PASS}$, which is lower than the program voltage $V_{PGM}$ and is only to form a channel in each cell, to the other word lines,
    applying a low voltage $V_{LOW}$, which is not to form a channel in a silicon contacting with the first insulating layer, to one cut-off gate line located under the two cells among the cut-off gate lines, and
    applying a high voltage $V_{HIGH}$, which is to form a channel, to the other cut-off gate lines; and
    for the purpose of programming the other cell toward the power supply line in the two cells desired to be programmed,
    by applying a bias voltage of $V_{CC}$ to the common source line and grounding the power supply line,
    applying a voltage to the second selective line in order to turn on only a second selective transistor connected to the other end of the bit line passing the two cells desired to be programmed, and applying a bias voltage respectively to the word lines and to the cut-off gate lines with the same condition as the case to program the opposite cell.

14. The method of claim 13, characterized by applying a voltage, which is same to or higher than a voltage $V_{CC}$, to the each second selective line in order to turn on the each second selective transistor, when programming one cell toward the common source line in the two cells desired to be programmed, applying a voltage, which is same to or higher than a voltage $V_{CC}$, to the each first selective line in order to turn on the each first selective transistor, when programming the other cell toward the power supply line in the two cells desired to be programmed, and floating the silicon substrate in the both cases.

15. A method of claim 12, further characterized by erasing memory cells of a block to be connected to a word line passing a specific cell at a time by grounding the word line passing the specific cell to erase information, and the cut-off gate line passing under the word line, floating the other lines, and applying a voltage which is high enough to pull out electrons from a charge storage layer of the specific cell, or to inject holes from a channel region of the specific cell to the charge storage layer of the specific cell, to the silicon substrate.

16. A method of claim 12, further characterized by reading information of a specific cell by applying a proper bias voltage respectively to the common source line, the power supply line, the each first selective line, the each second selective line, the each bit line, the each word line, the each cut-off gate line and the silicon substrate to turn on only the first selective transistor and the second selective transistor connected to both ends of a bit line passing the specific cell desired to read information, and measuring current which flows from the power supply line to the common source line on a specific standard voltage applied to a word line passing the specific cell.

17. The method of claim 16, characterized by reading information of the specific cell by changing a bias voltage condition of the common source line and the power supply line, further measuring current flowing from the common source line to the power supply line on the specific standard voltage applied to the word line passing the specific cell, and comparing the measured current with the current flowing in the opposite direction.

* * * * *